(12) United States Patent
Ramones et al.

(10) Patent No.: US 10,410,948 B2
(45) Date of Patent: Sep. 10, 2019

(54) INTEGRATED HEAT SINK AND ELECTROMAGNETIC INTERFERENCE (EMI) SHIELD ASSEMBLY

(71) Applicant: NETGEAR, Inc., San Jose, CA (US)

(72) Inventors: John Ramones, San Ramon, CA (US); Arun Raghupathy, Sunnyvale, CA (US)

(73) Assignee: Netgear, Inc., San Jose, CA (US)

(*) Notice: Subject to any disclaimer, the term of this patent is extended or adjusted under 35 U.S.C. 154(b) by 492 days.

(21) Appl. No.: 14/609,753

(22) Filed: Jan. 30, 2015

(65) Prior Publication Data

US 2016/0227673 A1 Aug. 4, 2016

(51) Int. Cl.
H01L 23/367 (2006.01)
H01L 23/467 (2006.01)
H01L 23/552 (2006.01)
H01L 21/48 (2006.01)

(52) U.S. Cl.
CPC ...... *H01L 23/3672* (2013.01); *H01L 21/4882* (2013.01); *H01L 23/552* (2013.01); *H01L 23/467* (2013.01)

(58) Field of Classification Search
None
See application file for complete search history.

(56) References Cited

U.S. PATENT DOCUMENTS

| | | | |
|---|---|---|---|
| 5,216,283 A * | 6/1993 | Lin | H01L 23/10 257/708 |
| 5,485,037 A | 1/1996 | Marrs | |
| 5,488,720 A | 1/1996 | Kierse | |
| 6,229,702 B1 * | 5/2001 | Tao | H01L 23/3675 165/80.2 |
| 6,462,655 B1 | 10/2002 | Ha | |
| 6,487,073 B2 | 11/2002 | McCullough et al. | |
| 6,580,167 B1 | 6/2003 | Glenn et al. | |
| 6,770,961 B2 * | 8/2004 | Lee | H01L 21/565 257/687 |
| 7,432,586 B2 | 10/2008 | Zhao et al. | |
| 7,622,793 B2 | 11/2009 | Anderson | |
| 2004/0217472 A1 | 11/2004 | Aisenbrey et al. | |
| 2005/0280139 A1 * | 12/2005 | Zhao | H01L 23/24 257/704 |
| 2009/0072382 A1 * | 3/2009 | Guzek | H01L 21/568 257/712 |
| 2013/0188319 A1 * | 7/2013 | Yamaguchi | H05K 7/2039 361/717 |
| 2013/0320517 A1 * | 12/2013 | Shirley | H01L 23/06 257/704 |
| 2014/0061893 A1 * | 3/2014 | Saeidi | H01L 23/16 257/712 |

* cited by examiner

Primary Examiner — Nisath Yasmeen
(74) Attorney, Agent, or Firm — Boyle Fredrickson, S.C.

(57) ABSTRACT

A heat sink and an EMI shield are integrated via injection molding. The heat sink and the EMI shield may be molded together as an integrated unit with an intervening non-electrically conductive layer formed between the heat sink and the EMI shield during the injection molding process. The integrated molded unit could also be molded to a thermally conductive layer comprising another material such as an elastomer suitable for more precisely conforming to the contours of an electrical component for maximizing thermal transfer. Accordingly, the number of steps and amount of materials required to provide thermal dissipation and EMI protection for an electrical component may be reduced.

12 Claims, 5 Drawing Sheets

INTEGRATED HEAT SINK AND ELECTROMAGNETIC INTERFERENCE (EMI) SHIELD ASSEMBLY

BACKGROUND OF THE INVENTION

1. Field of the Invention

The present invention relates to electrical components, and more particularly, to apparatuses and methods for providing thermal dissipation and shielding for electrical components.

2. Discussion of the Related Art

Many electronic products today include discrete electrical components, such as semiconductor integrated circuits, which generate substantial amounts of thermal energy during normal operation. However, if the thermal energy is too great without adequate cooling, permanent damage to the electrical component or product may result. In order to prevent such damage, a solution for thermal dissipation or cooling for the electrical component is typically necessary.

Known solutions for thermal dissipation typically include positioning a heat sink over the electrical component that generates the heat. Heat sinks are generally die cast articles manufactured from a material having a high thermal conductivity, such as aluminum. Heat sinks typically include a base with a series of heat dissipating elements or fins extending vertically upwardly from the base to maximize surface area. Air flow through the heat dissipating elements, with or without the assistance of a mechanical fan, operates to dissipate the thermal energy from the heat sink, and, in turn, from the electrical component.

Many electrical components also radiate substantial amounts electromagnetic energy which, if unaddressed, may exceed government regulations and/or interfere with other components of the electrical device or with other devices in the vicinity of the device. One technique in the art for addressing electromagnetic radiation is to physically cover the electrical component with a metallic Electromagnetic (or Radio Frequency) Interference (EMI) shield. EMI shields generally are stamped articles manufactured from metal for providing electromagnetic containment consistent with a Faraday shield.

Consequently, if an electrical component requires both a heat sink and an EMI shield, one or more layers of a thermal interface material must be used, such as between the heat sink and the EMI shield, and/or between the EMI shield and the component. However, placement of such respective articles with layers can be time consuming for assembly and production and are therefore inefficient. Each additional fabrication step also introduces the opportunity for error or defect. What is needed is an improved technique for continuing to provide thermal dissipation and EMI shielding for an electrical component.

SUMMARY OF THE INVENTION

Aspects of the present invention provide an integrated heat sink and EMI shield assembly that may be injection molded together. The technique may include molding the heat sink and the EMI shield together as an integrated unit with an intervening non-electrically conductive layer formed between the heat sink and the EMI shield during the injection molding process.

As used herein, injection molding refers to a manufacturing process for producing a part by which a material is injected into a mold. Injection materials may comprise thermally conductive polymers and elastomers.

The integrated molded unit also could be molded to a thermally conductive layer comprising another material, such as an elastomer, that is suitable for more precisely conforming to the contours of an electrical component for maximizing thermal transfer. The two phases could be performed, for example, using an injection molding process performed in either a single mold (using a two-shot molding process) or two separate molds (also using a two-shot molding process). The integrated molded unit also could be molded directly to the electrical component in the second phase or in an optional third phase.

Accordingly, the number of steps and amount of materials required to provide thermal dissipation and EMI protection for an electrical component may be reduced. Also, the amount of physical space required to provide thermal dissipation and EMI shielding for a component may be reduced by the integrated heat sink and EMI shield assembly.

Specifically, one aspect of the present invention may provide an integrated heat sink and EMI shield assembly comprising: a heat sink including: (a) a base; and (b) a plurality of heat dissipating elements; and an EMI shield molded to the heat sink to form an integrated molded unit. The integrated molded unit may provide a thermally conductive polymer layer between the heat sink and the EMI shield.

Another aspect of the present invention may include a method of manufacturing an integrated heat sink and EMI shield assembly comprising molding a heat sink, including a base and a plurality of heat dissipating elements, to an EMI shield to form an integrated molded unit. The integrated molded unit may provide a thermally conductive polymer layer between the heat sink and the EMI shield.

Yet another aspect of the present invention may provide a system for cooling an electrical component comprising: a thermally conductive heat sink including a base and a plurality of heat dissipating elements and an EMI shield molded to the heat sink to form an integrated molded unit. The integrated molded unit provides a first thermally conductive polymer layer portion between a lower surface of the base of the heat sink and an upper surface of the EMI shield and a second thermally conductive polymer layer portion beneath a lower surface of the EMI shield. The first and second thermally conductive polymer layer portions are connected to one another, and a thermally conductive elastomer layer molded to a bottom surface of the EMI shield with the second thermally conductive polymer layer portion disposed circumferentially around the thermally conductive elastomer layer.

These and other features and advantages of the invention will become apparent to those skilled in the art from the following detailed description and the accompanying drawings. It should be understood, however, that the detailed description and specific examples, while indicating preferred embodiments of the present invention, are given by way of illustration and not of limitation. Many changes and modifications may be made within the scope of the present invention without departing from the spirit thereof, and the invention includes all such modifications.

BRIEF DESCRIPTION OF THE DRAWINGS

Preferred exemplary embodiments of the invention are illustrated in the accompanying drawings in which like reference numerals represent like parts throughout, and in which.

DETAILED DESCRIPTION OF THE PREFERRED EMBODIMENTS

Figure 1:
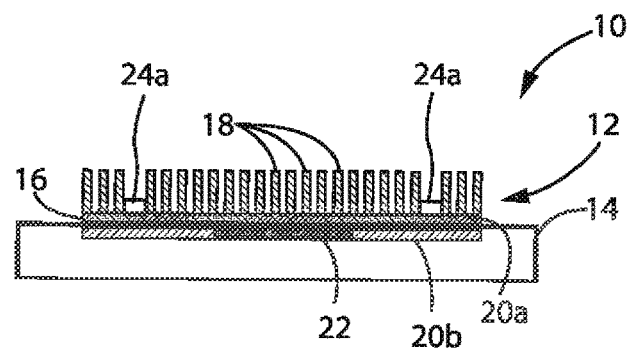
FIG. 1 is a sectional side elevation view of an integrated heat sink and EMI shield assembly with an elastomer layer in accordance with an embodiment of the invention.

Referring now to FIG. 1, a side view of an integrated system 10 for providing thermal dissipation and EMI shielding is provided in accordance with an embodiment of the invention. The integrated system 10 comprises a heat sink 12 and a metallic EMI shield 14 that are injection molded together to form an integrated molded unit 11 (shown in FIG. 2). The injection molding process provides a thermally conductive polymer layer between the heat sink 12 and the EMI shield 14 which joins the components together and prevents one from peeling away from the other. The injection molding process could also then provide, such as in a different phase, molding the integrated molded unit 11 to a thermally conductive elastomer layer 22 disposed beneath the EMI shield 14 to complete the integrated system 10. The elastomer layer 22 could more precisely conform to the contours of an electrical component disposed beneath for maximizing thermal transfer. The integrated system 10 may then be placed over an electrical component for providing thermal dissipation (cooling) and EMI containment.

The heat sink 12 may include a base 16 and a plurality of heat dissipating elements 18 or fins extending vertically upwardly from the base 16 to maximize surface area of the heat sink 12. The heat sink 12 may be manufactured from a metallic material having a relatively high thermal conductivity, such as aluminum, and may be die cast or otherwise formed as known in the art. Alternatively, the heat sink 12 could be injection molded using a thermally conductive polymer or similar material, such as in a different phase of the injection molding process or even simultaneously with the phase of integrating the heat sink 12 with the EMI shield 14. The heat sink 12 operatively provides thermal dissipation for an electrical component disposed beneath.

The EMI shield 14 may be an electrically conducting mesh or sheet manufactured from an EMI shielding material, such as aluminum, and may also be die cast or otherwise formed as known in the art. The EMI shield 14 may be grounded, floating or otherwise electrically connected, and operatively provides EMI containment for an electrical component disposed beneath the EMI shield 14, consistent with a Faraday shield or cage as known in the art.

The heat sink 12 and the EMI shield 14 are molded together to form the integrated molded unit 11. The molding process may comprise injecting a thermally conductive polymer layer that is non-electrically conductive into a mold to join the heat sink 12 and the EMI shield 14 together as a single integrated molded unit. The thermally conductive polymer layer may comprise a first polymer portion 20a disposed between a lower surface of the base 16 of the heat sink 12 and an upper surface of the EMI shield 14. The thermally conductive polymer layer may also comprise a second polymer portion 20b disposed beneath a lower surface of the EMI shield 14. The integrated molded unit 11 may, in turn, be molded to a thermally conductive elastomer layer 22 suitable for more precisely conforming to the contours of an electrical component disposed beneath.

Figure 2:
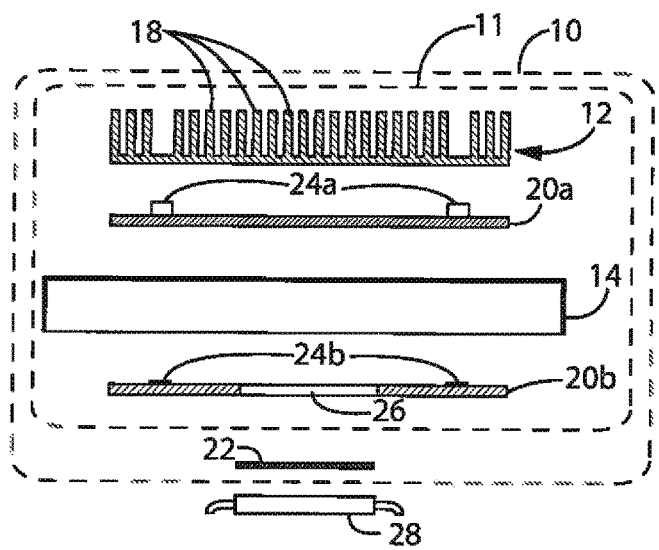
FIG. 2 is an exploded side elevation view of the integrated heat sink and EMI shield assembly of FIG. 1 and an electrical component in accordance with an embodiment of the invention.

Referring now to FIG. 2, an exploded side view of the integrated system 10 and an electrical component 28 are illustrated. In the embodiment, the integrated system 10 comprises the heat sink 12, followed by the first polymer portion 20a of the thermally conductive polymer layer 20, followed by the EMI shield 14, followed by the second polymer portion 20b of the thermally conductive polymer layer 20, followed by the elastomer layer 22. Although the thermally conductive polymer layer may be formed from a single injection molded material, the polymer layer of this embodiment substantially extends into or around the heat sink 12 and the EMI shield 14 to substantially integrate the two and prevent either from peeling away from the integrated assembly. Accordingly, in the exploded view of FIG. 2, the thermally conductive polymer layer is illustrated as broken between the first and second polymer portions 20a and 20b to exemplify this arrangement.

In the illustrated embodiment in which the thermally conductive polymer layer extends into the heat sink 12 and the EMI shield 14, the first polymer portion 20a may include stub portions 24a, and the second polymer portion 20b may include stub portions 24b. The stub portions 24a extend into openings of the heat sink 12 to retain the heat sink 12 to the integrated system 10. The stub portions 24b extend into openings of the EMI shield 14 to retain the EMI shield 14 to the integrated system 10. The stub portions 24b also represent areas in which the first and second polymer portions 20a and 20b are connected together to form the single injection molded thermally conductive polymer layer. In an alternative embodiment, the thermally conductive polymer layer could instead wrap around a portion of the heat sink 12 and/or the EMI shield 14, so long as the thermally conductive polymer layer operatively joins the heat sink 12 and the EMI shield 14 as a single integrated molded unit 11.

In this embodiment, the second polymer portion 20b may also form a cavity 26 for forming the elastomer layer 22. The cavity 26 is approximately centered beneath the EMI shield 14 and sized to substantially cover the electrical component 28. In a different phase, the integrated molded unit 11, comprising the heat sink 12 injection molded to a bottom surface of the EMI shield 14, could be injection molded to the elastomer layer 22 at the cavity 26. Accordingly, the second polymer portion 20b may be disposed circumferentially around the first elastomer layer 22. Then, the integrated system 10 could be placed over an upper surface of the electrical component 28 at a lower surface of the elastomer layer 22. In some embodiments, a bottom surface of the elastomer layer 22 may then be injection molded to the electrical component 28 in another injection molding phase.

Figure 3:
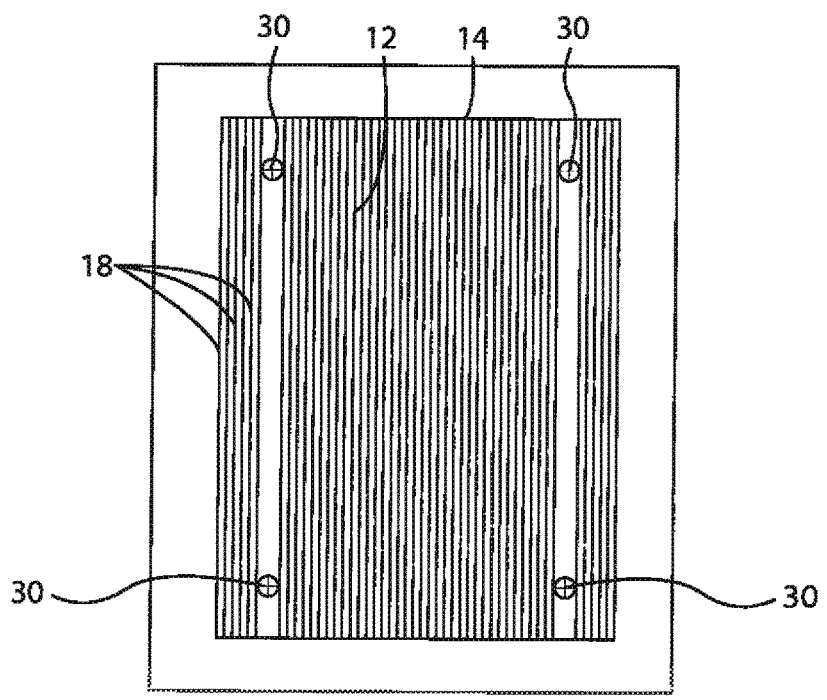
FIG. 3 is a top view of the integrated heat sink and EMI shield assembly of FIG. 1.

Referring now to FIG. 3, a top view of the integrated system 10 of FIG. 1 is provided. Openings 30 in the heat sink 12 and the EMI shield 14 may provide substantially aligned passageways by which the thermally conductive polymer layer may flow through the heat sink 12 and the EMI shield 14 during the injection molding process. The heat dissipating elements 18 may, if desired, be spaced further apart where adjacent to the openings 30. This can provide increased space for the thermally conductive polymer layer to attach to an upper surface of the base 16 of the heat sink 12, such as via the stubs portions 24a, to prevent the heat sink 12 from peeling away. Also, the EMI shield 14 may have a wider and longer area than the heat sink 12 as may be desirable for optimal EMI containment.

Figure 4:
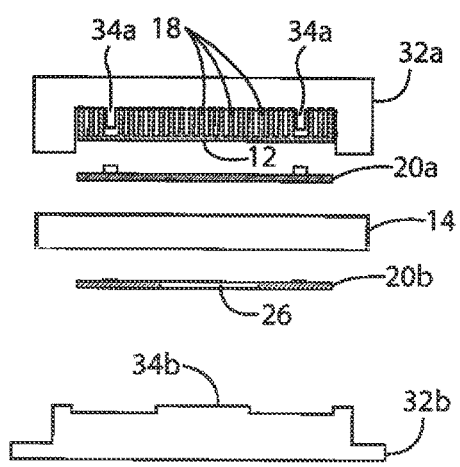
FIG. 4 is a sectional side elevation view of a first mold for manufacturing an integrated molded unit comprising an integrated heat sink, an EMI shield, and a thermally conductive polymer layer in accordance with another embodiment of the invention.
Figure 5:
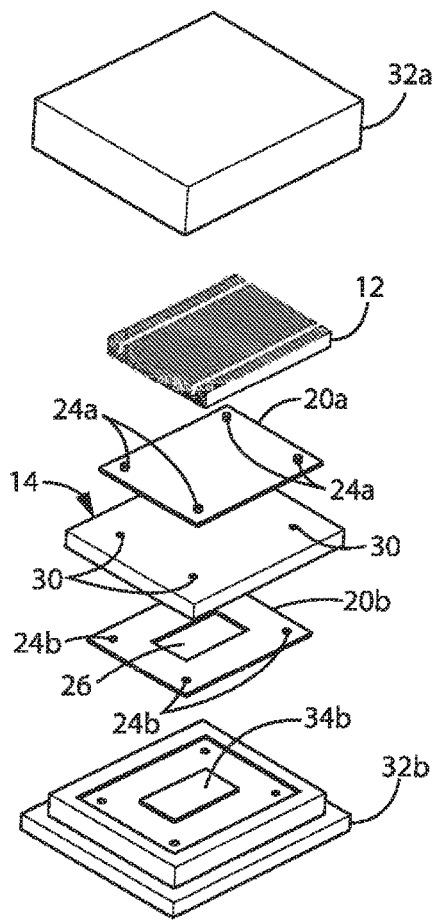
FIG. 5 is an exploded perspective view of the components of FIG. 4.

Referring now to FIG. 4, a side view of a first mold for manufacturing the integrated molded unit 11 comprising the heat sink 12, the EMI shield 14 and the thermally conductive polymer layer is provided in accordance with an embodiment of the invention. The first mold may include an upper mold cavity 32a and a lower mold cavity 32b. The heat sink 12 may be placed adjacent the upper mold cavity 32a, and the EMI shield 14 may be placed adjacent the lower mold cavity 32b. Accordingly, the upper and lower mold cavities 32a and 32b may include a plurality of contours specific to the heat sink 12 and the EMI shield 14. For example, the upper mold cavity 32a may include upper contours 34a extending over the openings 30 of the heat sink 12 to define an area for the thermally conductive polymer layer to extend into the heat sink 12, and the lower mold cavity 32b may include lower contours 34b defining the cavity 26. An exploded perspective view of the first mold for manufacturing the integrated molded unit 11 is provided in FIG. 5 in accordance with an embodiment of the invention.

In production, when the upper and lower mold cavities 32a and 32b are closed, a thermally conductive polymer material may be injected into the first mold to form the thermally conductive polymer layer 20. Upon cooling and hardening of the polymer material, the upper and lower mold cavities 32a and 32b may be opened, and the integrated molded unit 11 may be removed from the first mold.

Figures 6, 7:
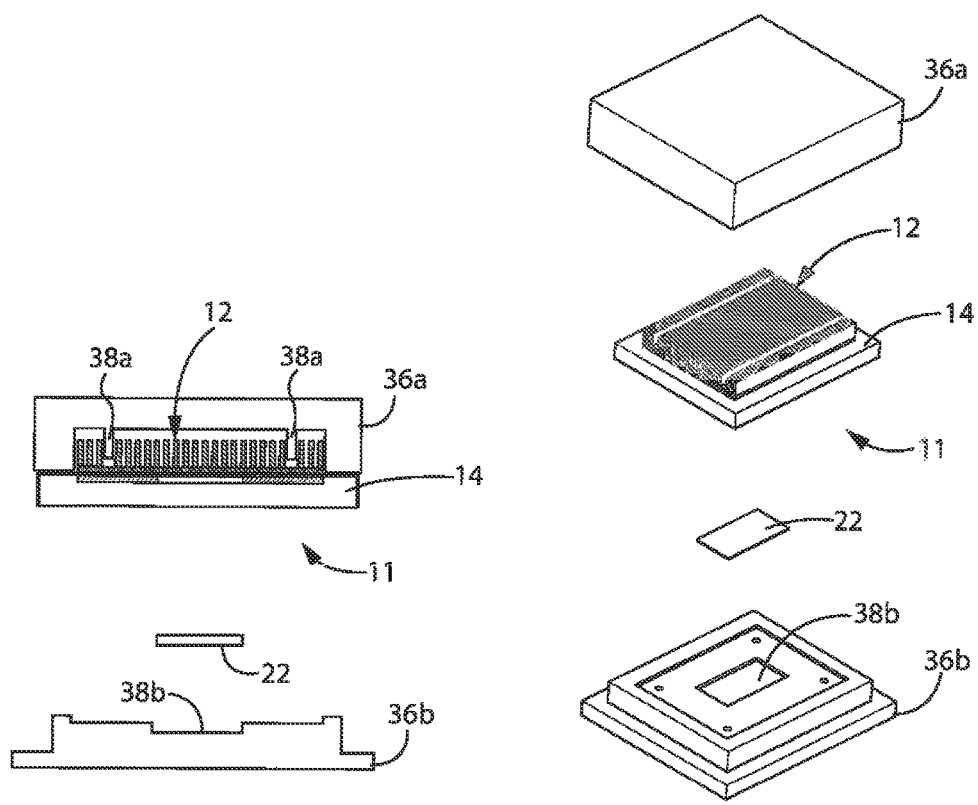
FIG. 6 is a sectional side elevation view of a second mold for manufacturing an integrated molded unit with a thermally conductive elastomer layer in accordance with an embodiment of the invention.
FIG. 7 is an exploded perspective view of the second mold of FIG. 6.

Referring now to FIG. 6, a side view of an optional second mold for manufacturing the integrated system 10 comprising the integrated molded unit 11 and the elastomer layer 22 is provided in accordance with an embodiment of the invention. The second mold similarly includes an upper mold cavity 36a and a lower mold cavity 36b. The integrated molded unit 11 may be placed within one of the upper and lower mold cavities 36a and 36b. Accordingly, the upper and lower mold cavities 36a and 36b may include a plurality of contours specific to the integrated molded unit 11. In addition, the lower mold cavity 36b may include a lower contour 38b to accommodate the elastomer layer 22 during the injection molding process. An exploded perspective view of the second mold for manufacturing the integrated system 10 is provided in FIG. 7.

In production, when the upper and lower mold cavities 36a and 36b are closed, a thermally conductive elastomer material may be injected into the second mold to form the thermally conductive elastomer layer 22. Upon cooling and hardening of the elastomeric material, the upper and lower mold cavities 36a and 36b may be opened, and the integrated system 10 may be removed from the second mold. Accordingly, the thermally conductive elastomer layer 22 may permit better conformance to the contours of an electrical component for maximizing thermal transfer.

Figure 8:
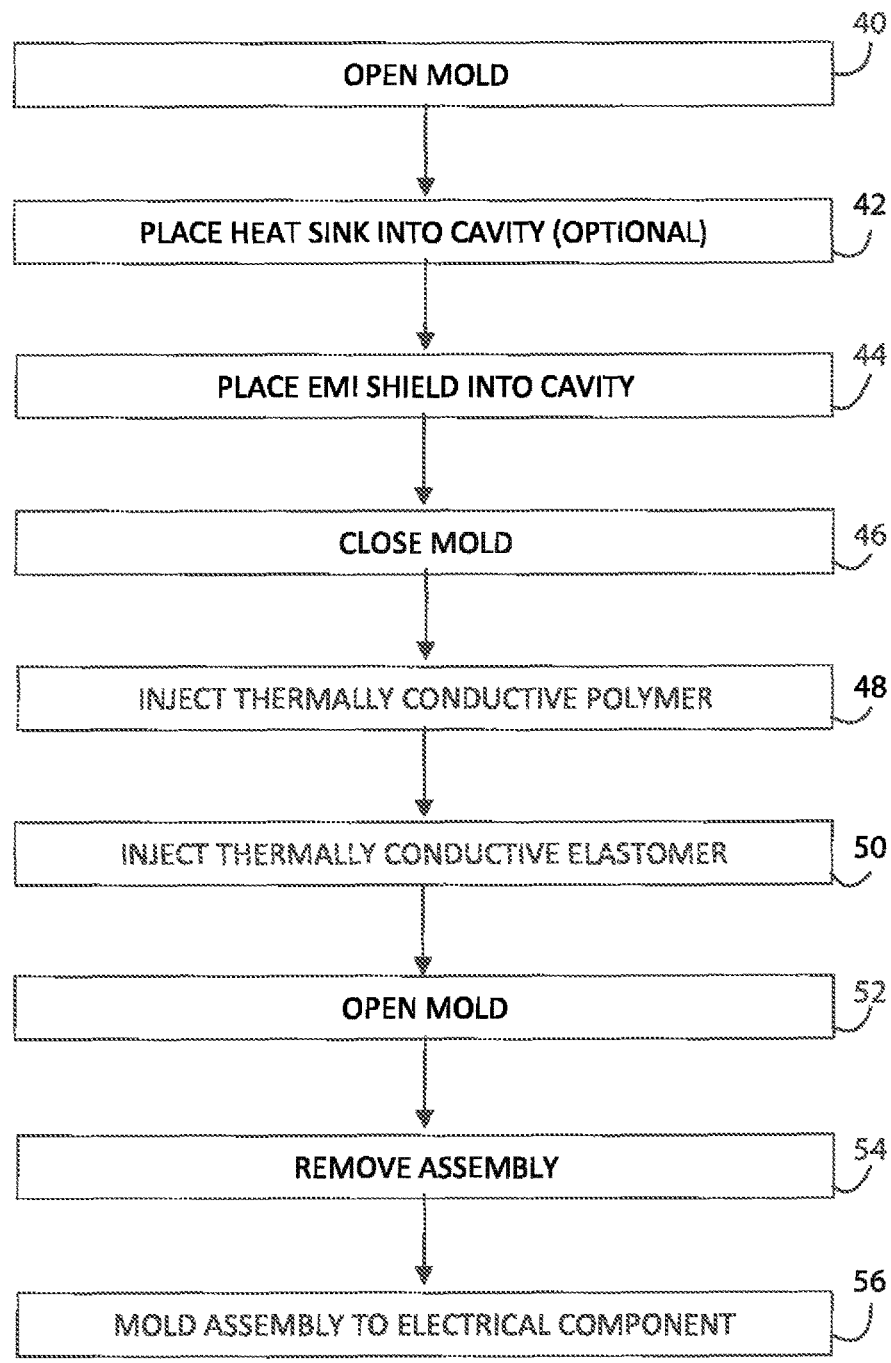
FIG. 8 is a flowchart illustrating a method for manufacturing an integrated heat sink and EMI shield assembly using a single mold in accordance with an embodiment of the invention.

Referring now to FIG. 8, a flowchart illustrating a first method for manufacturing an integrated heat sink and EMI shield assembly using a single mold and a two-shot injection or "two-shot" molding process is illustrated. In step 40, a single mold is initially opened. In step 42, a heat sink is placed into the mold. The heat sink may have been manufactured from metal or a thermally conductive molded polymer prior to placement into the cavity. Alternatively, if it is manufactured from a polymer, the heat sink itself may be manufactured in the mold (instead of being placed into the mold). In step 44, an EMI shield is placed into the mold. The EMI shield is typically manufactured from metal prior to placement into the mold. In step 46, the mold is closed.

In step 48, in a first injection mold shot, a thermally conductive polymer material is injected into a first set of cavities of the mold through a first orifice or set of orifices (not shown) to form a thermally conductive polymer layer integrating the heat sink 12 and the EMI shield 14. In step 50, in an optional second injection mold shot, a thermally conductive elastomer material is injected into a second set of cavities of the mold via another orifice or set of orifices (not shown) to form a thermally conductive elastomer layer molded to a bottom surface of the EMI shield. In step 52, upon cooling and hardening of the material, the mold is opened. In step 54, an integrated system, comprising the heat sink, the EMI shield, the thermally conductive polymer layer and the optional thermally conductive elastomer layer, is removed from the mold. In step 56, the integrated system may then be optionally molded to an electrical component, such as in a second mold.

Figure 9:
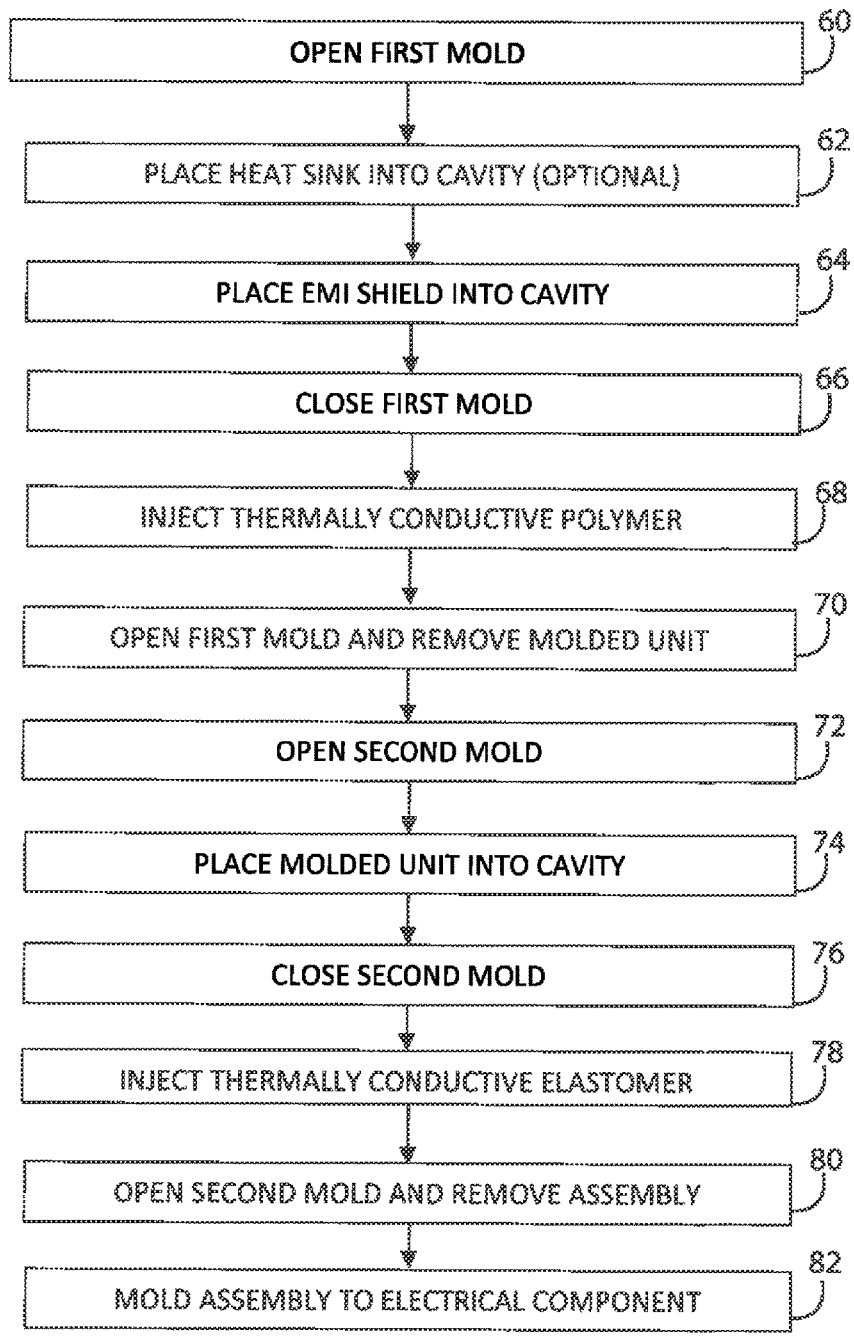
FIG. 9 is a flowchart illustrating a method for manufacturing an integrated heat sink and EMI shield assembly using two separate molds in accordance with an embodiment of the invention.

Referring now to FIG. 9, a flowchart illustrating a second method for manufacturing an integrated heat sink and EMI shield assembly using two separate molds is illustrated. In step 60, a first mold is initially opened. In step 62, a heat sink is placed into the first mold. The heat sink may have been manufactured from metal or a thermally conductive molded polymer prior to placement into the first mold. Alternatively, if manufactured from a polymer, the heat sink itself may be manufactured in the first mold (instead of being placed into the first mold). In step 64, an EMI shield is placed into the first mold. The EMI shield typically is manufactured from metal prior to placement into the first mold. In step 66, the first mold is closed.

In step 68, a thermally conductive polymer material is injected into a first set of cavities of the first mold via a first orifice or second set of offices to form a thermally conductive polymer layer integrating the heat sink and the EMI shield. In step 70, upon cooling and hardening of the material, the first mold is opened, and an integrated molded unit, comprising the heat sink, the EMI shield and the thermally conductive polymer layer, is removed from the first mold.

In step 72, a second mold is opened. In step 74, the integrated molded unit is placed into the second mold. In step 76, the second mold is closed. In step 78, a thermally conductive elastomer material is injected into a second set of cavities of the second mold via an orifice or set of offices to form a thermally conductive elastomer layer molded to a bottom surface of the EMI shield. In step 80, upon cooling and hardening of the material, the second mold is opened, and an integrated system, comprising the heat sink, the EMI shield, the thermally conductive polymer layer, and the thermally conductive elastomer layer, is removed from the second mold. In step 82, the integrated system may then be optionally molded to an electrical component, such as in a third mold.

Although the best mode contemplated by the inventors of carrying out the present invention is disclosed above, practice of the above invention is not limited thereto. It will be manifest that various additions, modifications and rearrangements of the features of the present invention may be made without deviating from the spirit and the scope of the underlying inventive concept.

It should be appreciated that such a development effort might be complex and time consuming, but would nevertheless be a routine undertaking of design, fabrication, and manufacture for those of ordinary skill having the benefit of this disclosure. Nothing in this application is considered critical or essential to the present invention unless explicitly indicated as being "critical" or "essential."

What is claimed is:

1. An integrated heat sink and Electromagnetic Interference (EMI) shield assembly comprising:
   (A) a heat sink including
      (a) a base; and
      (b) a plurality of heat dissipating elements; and
   (B) an EMI shield molded to the heat sink to form an integrated molded unit,
   wherein the integrated molded unit provides a thermally conductive polymer layer between the heat sink and the EMI shield,
   wherein the thermally conductive polymer layer comprises first and second portions, wherein the first and second portions are directly connected to one another with the EMI shield in between, wherein the thermally conductive polymer layer wraps around a portion of the heat sink to operatively join the heat sink to the EMI shield to form the integrated molded unit, wherein the second portion of the thermally conductive polymer layer comprises a lower surface having a flat portion disposed in a plane above an electrical component in an area surrounding the electrical component, and wherein the entire lower surface of the thermally conductive polymer layer is disposed above the electrical component.

2. The integrated assembly of claim 1, further comprising a thermally conductive elastomer layer, wherein the integrated molded unit is molded to the thermally conductive elastomer layer.

3. The integrated assembly of claim 2, wherein the second portion is disposed circumferentially around the thermally conductive elastomer layer.

4. The integrated assembly of claim 2, further comprising an electrical component, wherein the integrated molded unit and the thermally conductive elastomer layer are molded to the electrical component with the thermally conductive elastomer layer being disposed between the EMI shield and the electrical component.

5. The integrated assembly of claim 1, wherein the first and second portions are connected to one another through an opening of the EMI shield.

6. The integrated assembly of claim 1, wherein part of the first portion of the thermally conductive polymer layer extends into an opening of the heat sink.

7. The integrated assembly of claim 1, wherein the heat sink is formed from one of a metal and a thermally conductive molded polymer.

8. The integrated assembly of claim 7, wherein the heat dissipating elements comprise a plurality of fins extending at least generally vertically upward from the base.

9. A system for cooling an electrical component comprising:
   a thermally conductive heat sink including a base and a plurality of heat dissipating elements;
   a metallic EMI shield molded to the heat sink to form an integrated molded unit, wherein the integrated molded unit provides a first thermally conductive polymer layer portion between a lower surface of the base of the heat sink and an upper surface of the EMI shield and a second thermally conductive polymer layer portion beneath a lower surface of the EMI shield, wherein the first and second thermally conductive polymer layer portions are connected to one another with the EMI shield in between; and
   a thermally conductive elastomer layer molded to a bottom surface of the EMI shield with the second thermally conductive polymer layer portion disposed circumferentially around the thermally conductive elastomer layer,
   wherein the first thermally conductive polymer layer portion wraps around a portion of the heat sink to operatively join the heat sink to the EMI shield to form the integrated molded unit, and
   wherein a cavity is formed in the second thermally conductive polymer layer portion above the electrical component with the first thermally conductive polymer layer portion being between the heat sink and the EMI shield and the second thermally conductive polymer layer portion being below the EMI shield.

10. The system of claim 9, further comprising an electrical component, wherein a bottom surface of the thermally conductive elastomer layer is molded to an upper surface of the electrical component.

11. The system of claim 9, wherein the first and second thermally conductive polymer layer portions are connected to one another through an opening of the EMI shield.

12. An integrated heat sink and Electromagnetic Interference (EMI) shield assembly comprising:
   (A) a heat sink including
      (a) a base; and
      (b) a plurality of heat dissipating elements; and
   (B) an EMI shield molded to the heat sink to form an integrated molded unit,
   wherein the integrated molded unit provides a thermally conductive polymer layer between the heat sink and the EMI shield,
   wherein the thermally conductive polymer layer comprises first and second portions, wherein the first and second portions are directly connected to one another with the EMI shield in between,
   wherein the thermally conductive polymer layer wraps around a portion of the heat sink to operatively join the heat sink to the EMI shield to form the integrated molded unit,
   wherein the second portion of the thermally conductive polymer layer comprises a lower surface having a flat portion disposed in a plane above an electrical component in an area surrounding the electrical component,
   wherein the entire lower surface of the thermally conductive polymer layer is disposed above the electrical component, and
   wherein a cavity is formed in the second portion of the thermally conductive polymer layer with the first portion of the thermally conductive polymer layer being between the heat sink and the EMI shield and the second portion of the thermally conductive polymer layer being below the EMI shield.

* * * * *